United States Patent
Mimura

(10) Patent No.: US 12,480,884 B2
(45) Date of Patent: Nov. 25, 2025

(54) ANALYSIS APPARATUS, BONDING SYSTEM, AND ANALYSIS METHOD

(71) Applicant: Tokyo Electron Limited, Tokyo (JP)

(72) Inventor: Yuji Mimura, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 220 days.

(21) Appl. No.: 18/097,505

(22) Filed: Jan. 17, 2023

(65) Prior Publication Data

US 2024/0241061 A1  Jul. 18, 2024

(51) Int. Cl.
*G01N 21/85* (2006.01)
*H01L 21/683* (2006.01)

(52) U.S. Cl.
CPC ......... *G01N 21/85* (2013.01); *H01L 21/6835* (2013.01); *G01N 2021/8578* (2013.01)

(58) Field of Classification Search
None
See application file for complete search history.

(56) References Cited

U.S. PATENT DOCUMENTS

2024/0030013 A1* 1/2024 Hada ............... H01L 21/67253

FOREIGN PATENT DOCUMENTS

JP        2018147944 A  *  9/2018
WO   WO-2019195100 A1  * 10/2019 ......... C23C 16/4401

OTHER PUBLICATIONS

Niklaus (Niklaus, Frank & Enoksson, Peter & Kälvesten, Edvard & Stemme, Göran. (2001). Low-temperature full wafer adhesive bonding. J. Micromech. Microeng. 11. 100-107. 10.1088/0960-1317/11/2/303.) (Year: 2001).*

* cited by examiner

*Primary Examiner* — Uzma Alam
*Assistant Examiner* — Chad Andrew Reverman
(74) *Attorney, Agent, or Firm* — XSENSUS LLP

(57) ABSTRACT

An analysis apparatus according to an aspect of the present disclosure includes a substrate holding unit, an insertion unit, and a gas analysis unit. The substrate holding unit holds a bonded substrate where a first substrate and a second substrate are bonded. The insertion unit is capable of being inserted between a bonding surface of the first substrate and a bonding surface of the second substrate in the bonded substrate that is held by the substrate holding unit. The gas analysis unit analyzes a component(s) of a gas or gasses that is/are jetted from between a bonding surface of the first substrate and a bonding surface of the second substrate.

9 Claims, 10 Drawing Sheets

ANALYSIS APPARATUS, BONDING SYSTEM, AND ANALYSIS METHOD

FIELD

The present disclosure relates to an analysis apparatus, a bonding system, and an analysis method.

BACKGROUND

A technique that modifies a bonding surface of a substrate, hydrophilizes a modified surface of the substrate, and bonds both of such hydrophilized substrates due to a van der Waals' force and a hydrogen bond (an intermolecular force) has conventionally been known as a technique that bonds both of substrates such as semiconductor wafers (see Japanese Patent Application Publication No. 2018-147944).

SUMMARY

The present disclosure provides a technique that is capable of obtaining information for analyzing a mechanism(s) of a chemical reaction and/or bonding that occur(s) at a time of bonding of substrates.

DESCRIPTION OF EMBODIMENTS

Figure 1:
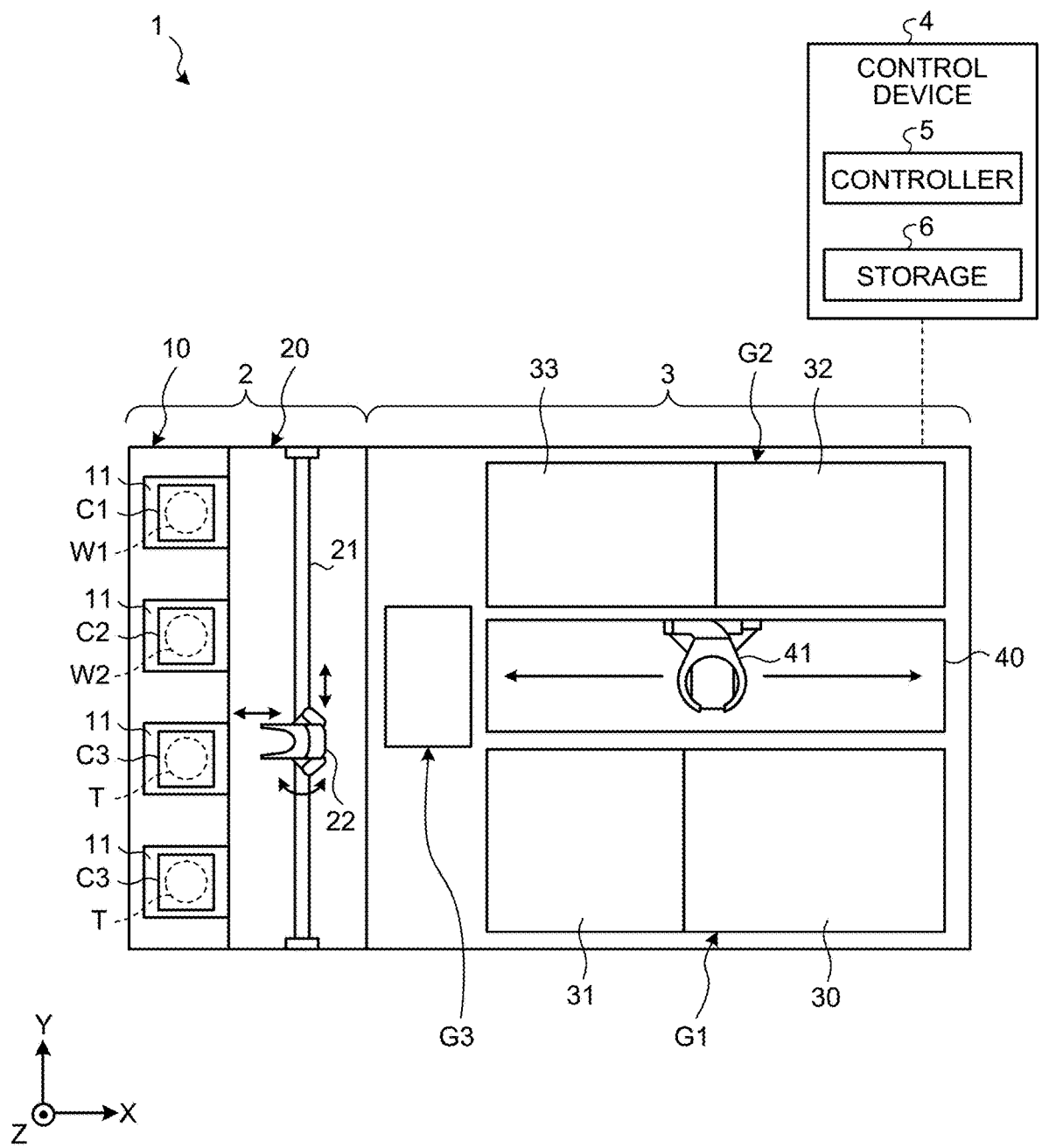
FIG. 1 is a schematic plan view that illustrates a configuration of a bonding system according to an embodiment.

Hereinafter, an embodiment(s) of an analysis apparatus, a bonding system, and an analysis method as disclosed in the present application will be explained in detail, with reference to the accompanying drawing(s). Additionally, the present disclosure is not limited by an embodiment(s) as illustrated below. Furthermore, the drawing(s) is/are schematic where it has to be noted that a relationship among dimensions of respective elements, a ratio of respective elements, and/or the like may be different from a real one (s). Moreover, parts where relationships among mutual dimensions and/or ratios thereof are different may also be included in mutual drawings.

A technique that modifies a bonding surface of a substrate, hydrophilizes a modified surface of the substrate, and bonds both of such hydrophilized substrates due to a van der Waals' force and a hydrogen bond (an intermolecular force) has conventionally been known as a technique that bonds both of substrates such as semiconductor wafers.

On the other hand, most of information, per se, for analyzing a detail(s) of a mechanism(s) of a chemical reaction and/or bonding that occur(s) at a time of bonding of substrates has not been obtained, so that such analysis has not been advanced in a current situation.

Hence, realization of a technology has been expected that is capable of overcoming a problem(s) as described above and obtaining information for analyzing a mechanism(s) of a chemical reaction and/or bonding that occur(s) at a time of bonding of substrates.

Configuration of Bonding System

Figure 2:
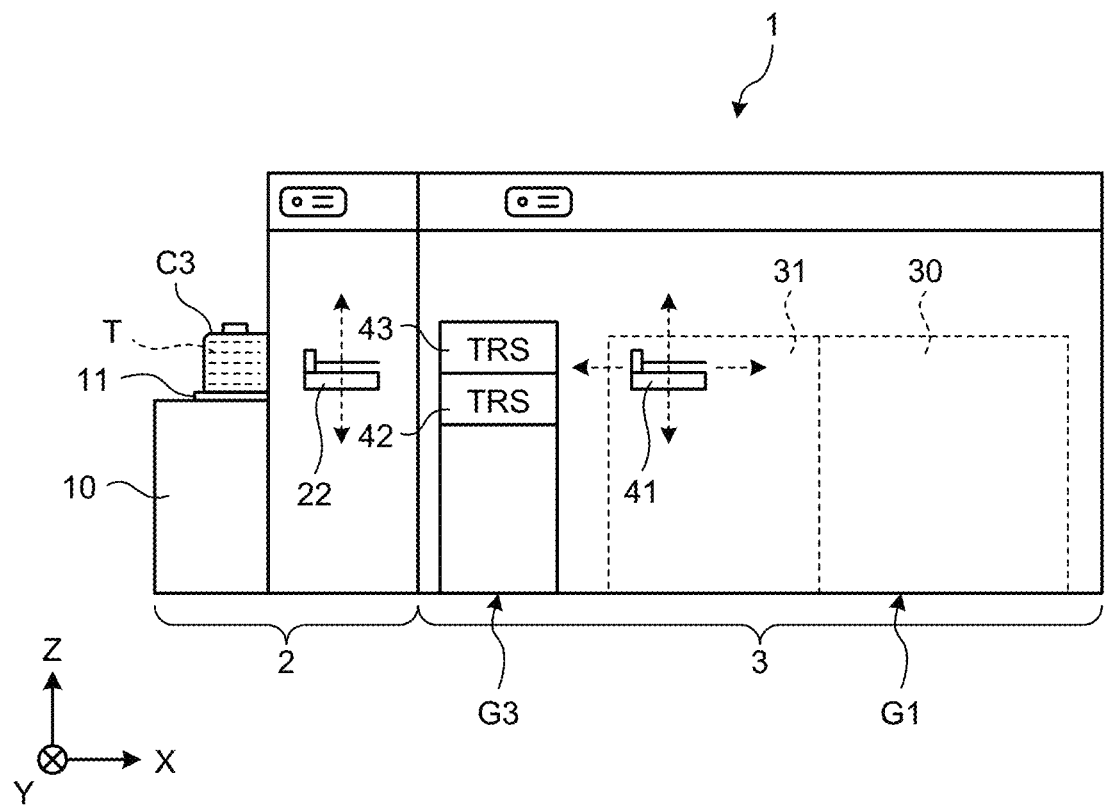
FIG. 2 is a schematic side view that illustrates a configuration of a bonding system according to an embodiment.
Figure 3:
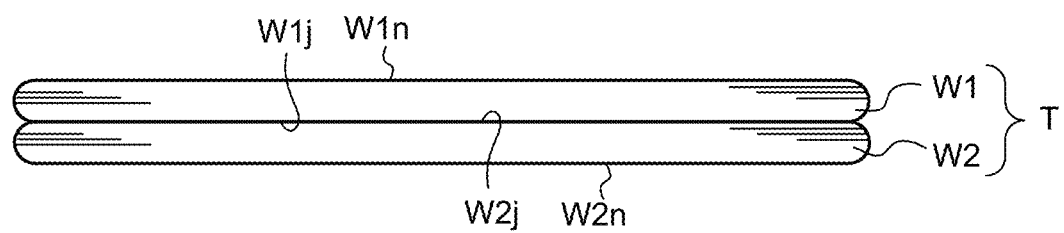
FIG. 3 is a schematic side view of a bonded substrate according to an embodiment.

First, a configuration of a bonding system 1 according to an embodiment will be explained with reference to FIG. 1 to FIG. 3. FIG. 1 is a schematic plan view that illustrates a configuration of the bonding system 1 according to an embodiment and FIG. 2 is a schematic side view thereof. Furthermore, FIG. 3 is a schematic side view of a bonded substrate T according to an embodiment. Additionally, in each drawing that will be referred to below, an orthogonal coordinate system where a vertically upward direction is provided as a positive direction of a Z-axis may be illustrated for a sake of clarity of an explanation.

The bonding system 1 as illustrated in FIG. 1 bonds a first substrate W1 and a second substrate W2 so as to form a bonded substrate T.

A first substrate W1 is, for example, a substrate where a plurality of electronic circuits are formed on a semiconductor substrate such as a silicon wafer and/or a compound semiconductor wafer. Furthermore, a second substrate W2 is, for example, a bare wafer where an electronic circuit is not formed. A first substrate W1 and a second substrate W2 have substantially identical diameters. Additionally, an electronic circuit may be formed on a second substrate W2.

Hereinafter, a first substrate W1 will be described as an "upper wafer W1" and a second substrate W2 will be described as a "lower wafer W2". That is, an upper wafer W1 is an example of a first substrate and a lower wafer W2 is an example of a second substrate.

Furthermore, hereinafter, as illustrated in FIG. 3, among plate surfaces of an upper wafer W1, a plate surface on a side that is bonded to a lower wafer W2 will be described as a "bonding surface W1$j$" and a plate surface on an opposite side of the bonding surface W1$j$ will be described as a "non-bonding surface Win". Furthermore, among plate surfaces of a lower wafer W2, a plate surface on a side that is bonded to an upper wafer W1 will be described as a "bonding surface W2j" and a plate surface on an opposite side of the bonding surface W2j will be described as a "non-bonding surface W2n".

As illustrated in FIG. 1, the bonding system 1 includes a carry-in/out station 2 and a processing station 3. The carry-in/out station 2 and the processing station 3 are arranged side by side in order of the carry-in/out station 2 and the processing station 3 along a positive direction of an X-axis. Furthermore, the carry-in/out station 2 and the processing station 3 are connected integrally.

The carry-in/out station 2 includes a placing pedestal 10 and a transfer area 20. The placing pedestal 10 includes a plurality of placing plates 11. On respective placing plate 11, respective cassettes C1, C2, C3 that house a plurality of (for example, 25) substrates in horizontal states thereof are placed. For example, a cassette C1 is a cassette that houses an upper wafer W1, a cassette C2 is a cassette that houses a lower wafer W2, and a cassette C3 is a cassette that houses a bonded substrate T.

The transfer area 20 is arranged so as to be adjacent to the placing pedestal 10 on a side of a positive direction of an X-axis. Such a transfer area 20 is provided with a transfer route 21 that extends in a direction of a Y-axis and a transfer device 22 that is capable of moving along such a transfer route 21.

The transfer device 22 is capable of moving in not only a direction of a Y-axis but also a direction of an X-axis and is capable of turning around a Z-axis. Then, the transfer device 22 executes transfer of an upper wafer W1, a lower wafer W2, and a bonded substrate T between the cassettes C1 to C3 that are placed on the placing plates 11 and a third processing block G3 of the processing station 3 as described later.

Additionally, a number of the cassettes C1 to C3 that are placed on the placing plates 11 is not limited to that illustrated in the figure. Furthermore, a cassette for recovering a substrate where a trouble is caused and/or the like other than the cassettes C1, C2, C3, may be placed on the placing plates 11.

The processing station 3 is provided with a plurality of processing blocks that include various types of devices, for example, three processing blocks G1, G2, G3. For example, a first processing block G1 is provided on a front side of the processing station 3 (a side of a negative direction of a Y-axis in FIG. 1) and a second processing block G2 is provided on a back side of the processing station 3 (a side of a positive direction of a Y-axis in FIG. 1). Furthermore, a third processing block G3 is provided in the processing station 3 on a side of the carry-in/out station 2 (a side of a negative direction of an X-axis in FIG. 1).

In the first processing block G1, a surface modification device 30 and an analysis apparatus 31 are arranged. The surface modification device 30 modifies a bonding surface W1j of an upper wafer W1 and a bonding surface W2j of a lower wafer W2, with plasma of a processing gas.

The surface modification device 30 breaks a bond of $SiO_2$ on a bonding surface W1j of an upper wafer W1 and a bonding surface W2j of a lower wafer W2 so as to provide SiO with a single bond, and subsequently, modifies such bonding surfaces W1j, W2j so as to be readily hydrophilized.

Additionally, in the surface modification device 30, for example, a predetermined processing gas is excited, is provided as plasma, and ionized under a reduced-pressure atmosphere. Then, an ion(s) of an element(s) that is/are included in such a processing gas irradiate(s) a bonding surface W1j of an upper wafer W1 and a bonding surface W2j of a lower wafer W2, so that the bonding surfaces W1j, W2j are plasma-processed and modified.

The analysis apparatus 31 is configured to be capable of releasing an upper wafer W1 from a bonded substrate T that is formed by a bonding device 33 as described later and it is possible to analyze a component(s) of a gas or gasses G (see FIG. 8) that is/are jetted from between a bonding surface W1j of the upper wafer W1 and a bonding surface W2j of a lower wafer W2 when a release thereof is executed. A detail(s) of such an analysis apparatus 31 will be described later.

In the second processing block G2, a surface hydrophilization device 32 and a bonding device 33 are arranged. The surface hydrophilization device 32 hydrophilizes a bonding surface W1j of an upper wafer W1 and a bonding surface W2j of a lower wafer W2 by, for example, pure water and washes the bonding surfaces W1j, W2j therewith.

In the surface hydrophilization device 32, for example, while an upper wafer W1 or a lower wafer W2 that is held by a spin chuck is rotated, pure water is supplied onto such an upper wafer W1 or a lower wafer W2. Thereby, pure water that is supplied onto an upper wafer W1 or a lower wafer W2 is diffused on a bonding surface W1j of the upper wafer W1 or a bonding surface W2j of the lower wafer W2, so that the bonding surfaces W1j, W2j are hydrophilized.

The bonding device 33 bonds an upper wafer W1 and a lower wafer W2. In the bonding device 33, for example, an upper wafer W1 and a lower wafer W2 are brought closer in such a manner that a bonding surface W1j and a bonding surface W2j that are hydrophilized face one another, and parts (for example, central parts) of both of facing bonding surfaces are caused to contact one another, so that mutually bonding sites thereof extend on whole surfaces thereof. Thereby, wholes of both of bonding surfaces are bonded, so that a bonded substrate T is formed from an upper wafer W1 and a lower wafer W2.

In the third processing block G3, as illustrated in FIG. 2, transition (TRS) devices 42, 43 for an upper wafer W1, a lower wafer W2, and a bonded substrate T are provided sequentially from a bottom thereof and as two layers.

Furthermore, as illustrated in FIG. 1, a transfer area 40 is formed in an area that is surrounded by the first processing block G1, the second processing block G2, and the third processing block G3. A transfer device 41 is arranged in the transfer area 40. The transfer device 41 has, for example, a transfer arm that is movable in a vertical direction and a horizontal direction and around a vertical axis.

Such a transfer device 41 moves in the transfer area 40 and transfers an upper wafer W1, a lower wafer W2, and a bonded substrate T to predetermined devices in the first processing block G1, the second processing block G2, and the third processing block G3 that are adjacent to the transfer area 40.

Furthermore, the bonding system 1 includes a control device 4. The control device 4 controls an operation of the bonding system 1. Such a control device 4 is, for example, a computer and includes a controller 5 and a storage 6. A program that controls various types of processes such as a bonding process is stored in the storage 6. The controller 5 reads and executes a program that is stored in the storage 6 so as to control an operation of the bonding system 1.

Additionally, such a program may be recorded in a computer-readable recording medium and be installed in the storage 6 of the control device 4 from such a recording medium. For a computer-readable recording medium, for example, a hard disk (HD), a flexible disk (FD), a compact disk (CD), a magnetooptical disk (MO), a memory card, and/or the like are provided.

In the bonding system 1 that is configured as described above, first, the transfer device 22 takes an upper wafer W1 from the cassette C1 that is placed in the carry-in/out station 2 and carries such a taken upper wafer W1 in the transition devices 42, 43 in the third processing block G3.

Subsequently, an upper wafer W1 is taken from the transition devices 42, 43 and is carried in the surface modification device 30, by the transfer device 41. Then, the surface modification device 30 executes a surface modification process for an upper wafer W1. A bonding surface W1j of an upper wafer W1 is modified in such a surface modification process.

Subsequently, an upper wafer W1 is taken from the surface modification device 30 and is carried in the surface hydrophilization device 32, by the transfer device 41. Then, the surface hydrophilization device 32 executes a surface hydrophilization process for an upper wafer W1. A bonding surface W1j of an upper wafer W1 is hydrophilized in such a surface hydrophilization process.

Subsequently, an upper wafer W1 is taken from the surface hydrophilization device 32 and is carried in the bonding device 33, by the transfer device 41.

Furthermore, in parallel with a process for an upper wafer W1 as thus far explained, the transfer device 22 takes a lower wafer W2 from the cassette C2 that is placed in the carry-in/out station 2 and carries such a taken lower wafer W2 in the transition devices 42, 43 in the third processing block G3.

Subsequently, a lower wafer W2 is taken from the transition devices 42, 43 and is carried in the surface modification device 30, by the transfer device 41. Then, the surface modification device 30 executes a surface modification process for a lower wafer W2. A bonding surface W2j of a lower wafer W2 is modified by such a surface modification process.

Subsequently, a lower wafer W2 is taken from the surface modification device 30 and is carried in the surface hydrophilization device 32, by the transfer device 41. Then, the surface hydrophilization device 32 executes a surface hydrophilization process for a lower wafer W2. A bonding surface W2j of a lower wafer W2 is hydrophilized by such a surface hydrophilization process.

Subsequently, a lower wafer W2 is taken from the surface hydrophilization device 32 and is carried in the bonding device 33, by the transfer device 41.

Then, an upper wafer W1 and a lower wafer W2 that are carried in the bonding device 33 are bonded in the bonding device 33, so that a bonded substrate Tis formed. Such a bonded substrate T is transferred to the cassette C3 through the transfer device 41, the transition devices 42, 43, and the transfer device 22.

Furthermore, the controller 5 transfers a bonded substrate T that is formed by the bonding device 33 to the analysis apparatus 31, by the transfer device 41, so that it is also possible to execute an analysis process for the bonded substrate T.

Configuration of Analysis Apparatus

Figure 4:
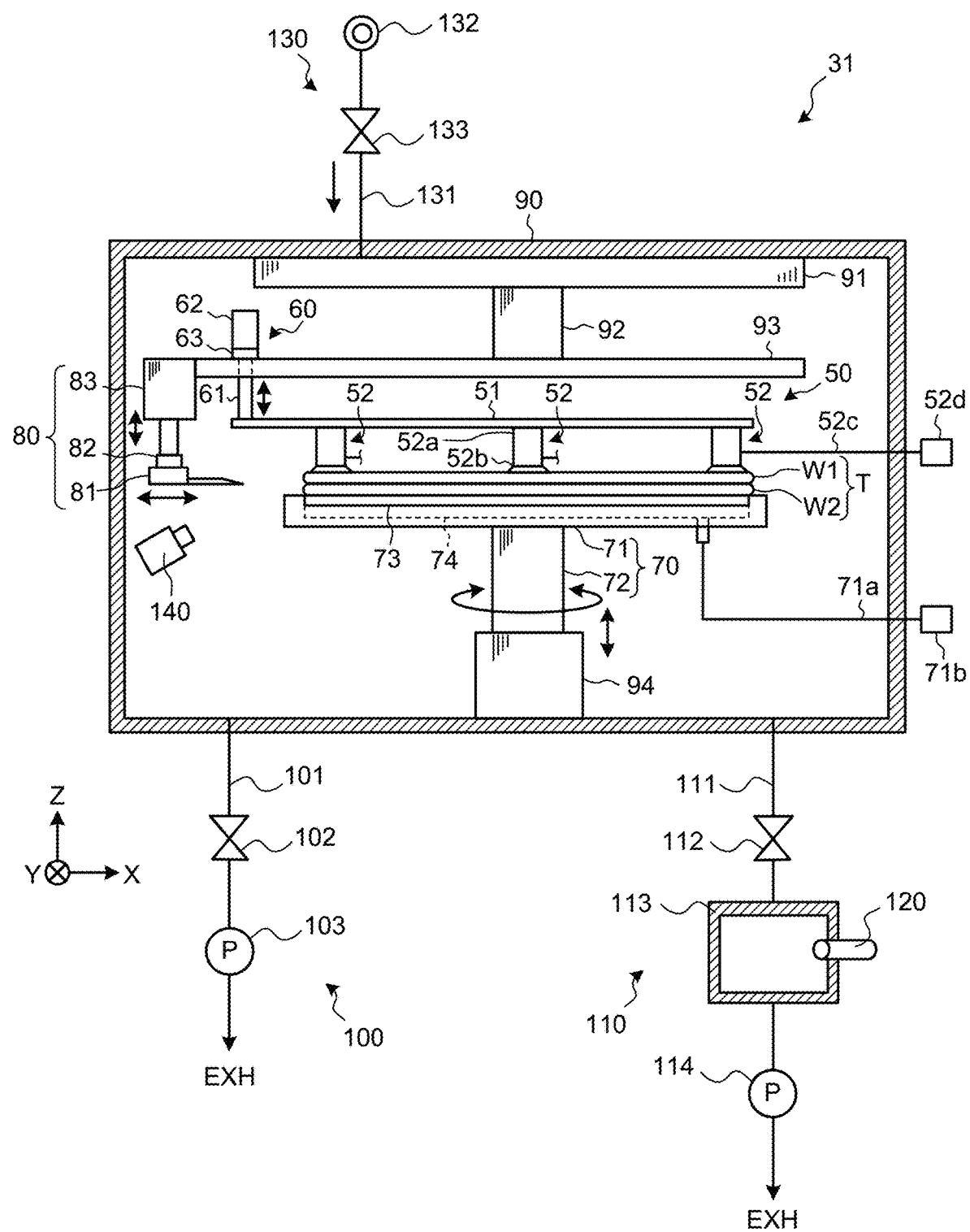
FIG. 4 is a schematic side view that illustrates a configuration of an analysis apparatus according to an embodiment.

Next, a configuration of an analysis apparatus 31 that is installed in a first processing block G1 will be explained with reference to FIG. 4 and FIG. 5. FIG. 4 is a schematic side view that illustrates a configuration of the analysis apparatus 31 according to an embodiment.

As illustrated in FIG. 4, the analysis apparatus 31 includes a chamber 90. A (non-illustrated) carrying-in/out port is provided on a side surface of the chamber 90. The analysis apparatus 31 includes a substrate holding unit 50, a movement unit 60, a substrate holding unit 70, and a release induction unit 80 where these are arranged inside the chamber 90.

In the analysis apparatus 31, a substrate holding unit 50 adsorbs and holds a bonded substrate T on a side of an upper wafer W1 from a top thereof and a substrate holding unit 70 adsorbs and holds the bonded substrate T on a side of a lower wafer W2 from a bottom thereof. Then, in the analysis apparatus 31, a movement unit 60 moves an upper wafer W1 in a direction away from a plate surface of a lower wafer W2.

Thereby, an upper wafer W1 that is held by a first holding unit is continuously released from a lower wafer W2, from one end to another end thereof. Hereinafter, each component will be explained specifically.

The substrate holding unit 50 includes an elastic member 51 and a plurality of adsorption units 52. The elastic member 51 is a member with a sheet shape and is formed of, for example, a metal such as a sheet metal. Such an elastic member 51 is arranged so as to face an upper wafer W1 above the upper wafer W1.

The plurality of adsorption units 52 are provided on a surface of the elastic member 51 that faces an upper wafer W1. Each adsorption unit 52 includes a body unit 52a that is fixed on the elastic member 51 and an adsorption pad 52b that is provided on a bottom part of such a body unit 52a.

Each adsorption unit 52 is connected to an air intake device 52d such as a vacuum pump through an air intake pipe 52c. In the substrate holding unit 50, the plurality of adsorption units 52 adsorb a non-bonding surface Win (see FIG. 3) of an upper wafer W1 due to an attractive force that is generated by the air intake device 52d. Thereby, an upper wafer W1 is adsorbed and held by the substrate holding unit 50.

Additionally, the adsorption pad 52b that is included in the adsorption unit 52 is preferably a type with a smaller amount of deformation. This is because, as the adsorption pad 52b is greatly deformed at a time when the movement unit 60 as described later pulls the substrate holding unit 50, a part to be adsorbed on an upper wafer W1 may greatly be deformed due to such deformation so as to damage the upper wafer W1 or a lower wafer W2.

Specifically, for the adsorption pad 52b, for example, one that has a rib on an adsorption surface, a flat pad with a space height of 0.5 mm or less, and/or the like is/are used preferably.

Herein, a configuration of the substrate holding unit 50 will be explained more specifically with reference to FIG. 5. FIG. 5 is a schematic plan view of the substrate holding unit 50 according to an embodiment.

Figure 5:
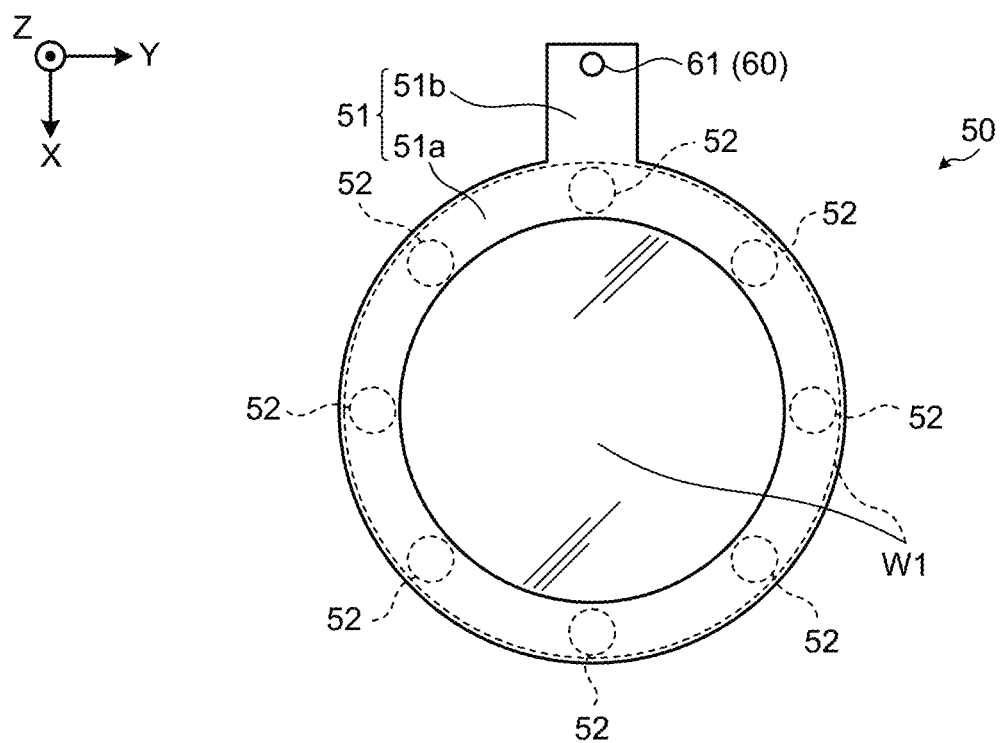
FIG. 5 is a schematic plan view of a substrate holding unit according to an embodiment.

As illustrated in FIG. 5, the plurality of adsorption units 52 that are included in the substrate holding unit 50 are arranged side by side annularly relative to the elastic member 51, face an outer peripheral part of an upper wafer W1, and each adsorb the outer peripheral part of an upper wafer W1. Although an example of a case where 8 adsorption units 52 are provided for the elastic member 51 is illustrated herein, a number of an adsorption unit(s) 52 that is/are provided on the elastic member 51 is not limited to 8.

Among such a plurality of adsorption units 52, an adsorption unit 52 that is arranged on a side that is closest to a starting point of a release (herein, a side of a negative direction of an X-axis) is arranged at a position that is close to a site that contacts a blade unit 81 (see FIG. 4) of the release induction unit 80 (see FIG. 4) as described later. In other words, the blade unit 81 of the release induction unit 80 contacts a side surface of a bonded substrate T near an adsorption unit 52 that is arranged on a side of a negative direction of an X-axis.

The elastic member 51 includes a body unit 51a and an extension unit 51b. The body unit 51a is a frame body with a ring shape where an outer diameter thereof is substantially identical to a diameter of an upper wafer W1 and a central part thereof is hollow. The plurality of adsorption units 52 are provided side by side annularly along a shape of the body unit 51a on a bottom surface of such a body unit 51a, that is, a surface that faces an upper wafer W1.

The extension unit 51b is a site where a part of an outer peripheral part that is positioned on a side that is closest to a starting point of a release (herein, an outer peripheral part on a side of a negative direction of an X-axis) extends toward a side that is opposite to an advancing direction of a release (a side of a negative direction of an X-axis), on an outer peripheral part of the body unit 51a. Then, a tip of such an extension unit 51b is connected to a pole member 61 of the movement unit 60.

By returning to FIG. 4, another component of the analysis apparatus 31 will be explained. The movement unit 60 includes the pole member 61, a driving mechanism 62, and a load cell 63.

The pole member 61 is a member that extends in a vertical direction (a direction of a Z-axis) where one end part thereof is connected to the extension unit 51b (see FIG. 5) of the elastic member 51 and another end part thereof is connected to the driving mechanism 62 through an upper base unit 93.

The driving mechanism 62 is fixed on a top part of the upper base unit 93 and moves the pole member 61 that is connected to a bottom part thereof, in a vertical direction. The load cell 63 detects a load that is applied to the pole member 61.

In such a movement unit 60, the pole member 61 is moved in a vertically upward direction by using the driving mechanism 62, so that the substrate holding unit 50 that is linked to the pole member 61 is pulled up. Herein, it is possible for the movement unit 60 to pull the substrate holding unit 50 while a force that is applied to an upper wafer W1 is controlled, based on a result of detection that is executed by the load cell 63.

Herein, as illustrated in FIG. 5, the pole member 61 that is provided as a point of effort for pulling up is arranged on an opposite side of the adsorption unit 52 that is provided as a point of fulcrum for pulling up, that is, the adsorption unit 52 that is arranged on a side that is closest to a starting point of a release (herein, a side of a negative direction of an X-axis) in an advancing direction of a release.

Therefore, a clockwise torque (moment) in FIG. 4 is generated on a side surface (a site that is provided as a starting point of a release) of a bonded substrate T that is provided as a point of lead for pulling up. Thereby, it is possible for the movement unit 60 to pull an upper wafer W1 so as to peel up it from an outer edge part thereof, so that it is possible to release the upper wafer W1 from a lower wafer W2 efficiently.

Additionally, as illustrated in FIG. 4, the substrate holding unit 50 is supported by the movement unit 60 and the movement unit 60 is supported by the upper base unit 93. Furthermore, the upper base unit 93 is supported by a fixation member 91 that is attached to a ceiling part of the chamber 90 through a pole 92.

The substrate holding unit 70 is arranged below the substrate holding unit 50 and adsorbs and holds a bonded substrate T on a side of a lower wafer W2. Such a substrate holding unit 70 includes a body unit 71 with a disk shape and a pole member 72 that supports the body unit 71.

The body unit 71 is formed of, for example, a metal member such as aluminum. An adsorption surface 73 is provided on an upper surface of such a body unit 71. The adsorption surface 73 is a porous body and is formed of, for example, a resin member such as poly(chlorotrifluoroethylene) (PCTFE).

A suction space 74 that is communicated with an outside through the adsorption surface 73 is formed inside the body unit 71. The suction space 74 is connected to an air intake device 71b such as a vacuum pump through an air intake pipe 71a. Such a substrate holding unit 70 causes a non-bonding surface W2n (see FIG. 3) of a lower wafer W2 to adsorb to the adsorption surface 73 by utilizing a negative pressure that is generated by an air intake of the air intake device 71b, so as to adsorb and hold a bonded substrate T.

Furthermore, as a non-adsorption part such as a groove is formed on an adsorption surface of a lower wafer W2, a crack may be generated at such a non-adsorption part on the lower wafer W2. Hence, the adsorption surface 73 of the body unit 71 is provided as a flat surface that does not have a non-adsorption part such as a groove. Thereby, it is possible to prevent a crack from being generated on a lower wafer W2.

Moreover, the adsorption surface 73 is formed of a resin member such as PCTFE, so that it is possible to further reduce or prevent damage to a lower wafer W2.

The substrate holding unit 70 is supported by a rotation lifting/lowering mechanism 94 that is fixed on a floor surface of the chamber 90. The rotation lifting/lowering mechanism 94 rotates the pole member 72 around a vertical axis, so as to rotate the substrate holding unit 70. Furthermore, the rotation lifting/lowering mechanism 94 moves the pole member 72 in a vertical direction, so as to lift or lower the substrate holding unit 70.

The release induction unit 80 is arranged outside the substrate holding unit 70. Such a release induction unit 80 forms a site that is provided as a starting point where an upper wafer W1 is released from a lower wafer W2, on a side surface of a bonded substrate T.

The release induction unit 80 includes a blade unit 81, a movement mechanism 82, and a movement mechanism 83. The blade unit 81 is an example of an insertion part. The blade unit 81 is, for example, a flat blade, and is supported by the movement mechanism 82 in such a manner that a blade edge thereof protrude toward a bonded substrate T.

The movement mechanism 82 moves the blade unit 81 in a horizontal direction along a rail that extends in a direction of an X-axis. The movement mechanism 83 is fixed on, for example, the upper base unit 93 and moves the movement mechanism 82 in a vertical direction. By such a movement mechanism 83, a height position of the blade unit 81, that is, a position of contact with a side surface of a bonded substrate T, is adjusted.

In the release induction unit 80, a height position of the blade unit 81 is adjusted by using the movement mechanism 83, and subsequently, the blade unit 81 is moved in a horizontal direction (herein, a positive direction of an X-axis) by using the movement mechanism 82. Moreover, the release induction unit 80 causes the blade unit 81 to contact a bonding surface W1j of an upper wafer W1 and a bonding surface W2j of a lower wafer W2 that are exposed to a side surface of a bonded substrate T. Thereby, a site that is provided as a starting point where an upper wafer W1 is released from a lower wafer W2 is formed on a bonded substrate T.

Furthermore, the chamber 90 is connected to a first exhaust unit 100 and a second exhaust unit 110 that exhaust an inside of such a chamber 90. The first exhaust unit 100 has a first exhaust route 101, a valve 102, and a pump 103. The first exhaust route 101 is an example of another exhaust route and the pump 103 is an example of another exhaust mechanism.

The first exhaust route 101 connects an inside of the chamber 90 and an exhaust unit EXH. The valve 102 is a valve that controls on and off of exhaust of an inside of the chamber 90.

The pump 103 is positioned on a downstream side of the valve 102 on the first exhaust route 101. The pump 103 exhausts an inside of the chamber 90 and delivers an exhaust gas to the exhaust unit EXH.

The second exhaust unit 110 has a second exhaust route 111, a valve 112, a retention unit 113, and a pump 114. The second exhaust route 111 is an example of an exhaust route and the pump 114 is an example of an exhaust mechanism.

The second exhaust route 111 is a route that is different from the first exhaust route 101 as described above and connects an inside of the chamber 90 and the exhaust unit EXH. The valve 112 is a valve that controls on and off of exhaust of an inside of the chamber 90.

The retention unit 113 is positioned on a downstream side of the valve 112 on the second exhaust route 111. The retention unit 113 is a member with a box shape that has a space in an inside thereof.

The pump 114 is positioned on a downstream side of the retention unit 113 on the second exhaust route 111. The pump 114 exhausts an inside of the chamber 90 and delivers an exhaust gas to the exhaust unit EXH.

Furthermore, the retention unit 113 of the second exhaust unit 110 is connected to a gas analysis unit 120. The gas analysis unit 120 is, for example, a quadrupole mass spectrometer (QMS) where it is possible to detect a kind(s) of a gas or gasses that flow(s) into the retention unit 113, an amount of each gas species, and the like.

Furthermore, the chamber 90 is connected to a gas supply unit 130 that supplies a gas for releasing an inside of the chamber 90 with a reduced pressure at an atmospheric pressure. The gas supply unit 130 has a supply route 131, a gas supply source 132, and a valve 133.

The supply route 131 connects the gas supply source 132 and an inside of the chamber 90. The gas supply source 132 is, for example, a tank that stores a gas (for example, a nitrogen gas and/or the like) for releasing an inside of the chamber 90 at an atmospheric pressure. The valve 133 is a valve that controls on and off of gas supply from the gas supply source 132.

Furthermore, the chamber 90 is provided with a camera 140 that is capable of capturing an image of an inside thereof. For example, such a camera 140 is positioned on a side of a negative direction of an X-axis relative to a bonded substrate T that is held by the substrate holding units 50, 70 and is capable of capturing an image of a space between a bonding surface W1j of an upper wafer W1 and a bonding surface W2j of a lower wafer W2 that are exposed to a side surface of a bonded substrate T.

Moreover, the chamber 90 is provided with a non-illustrated heating mechanism. It is possible for such a heating mechanism to heat the chamber 90.

Detail(s) of Analysis Process

Figure 6:
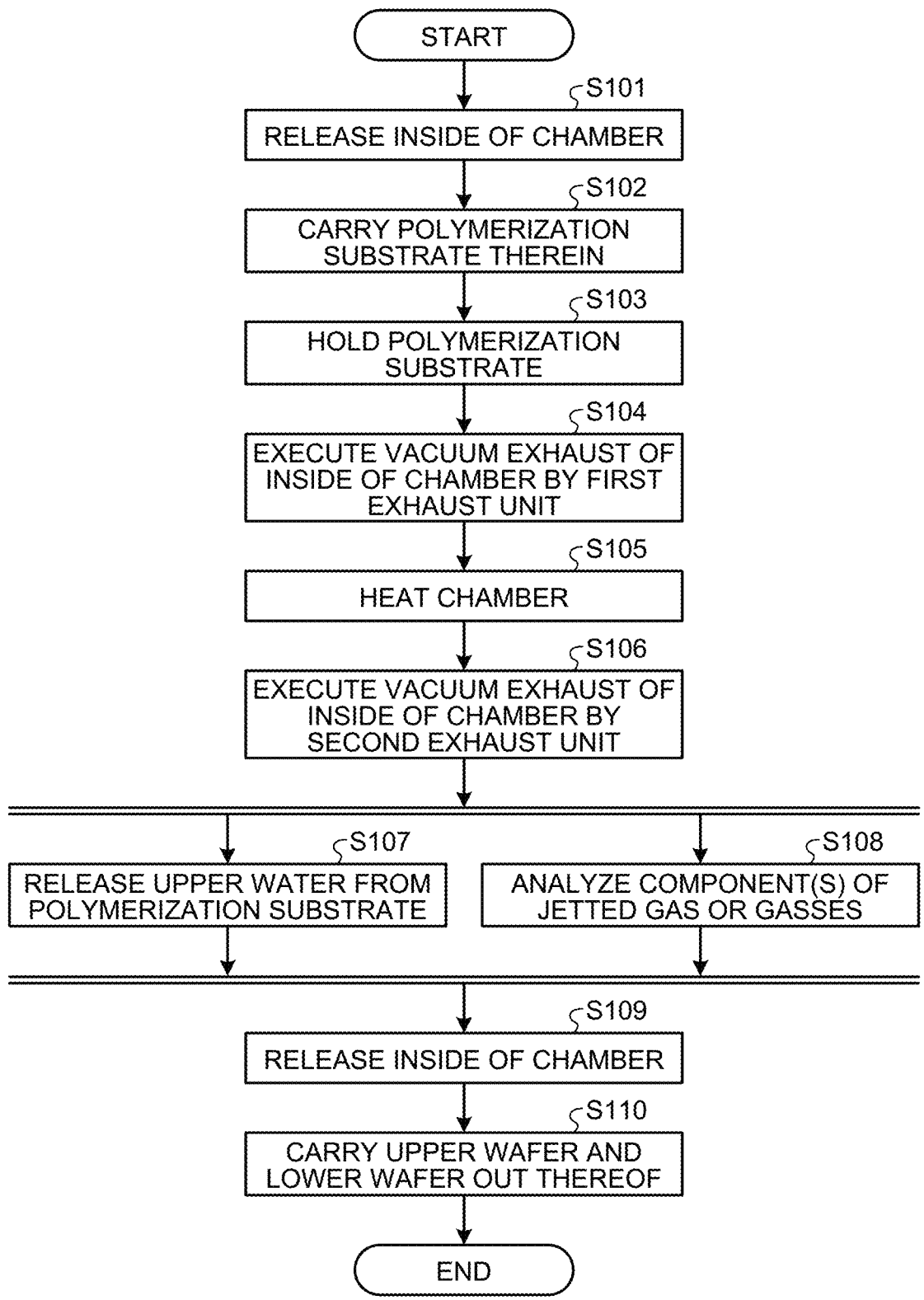
FIG. 6 is a flowchart that illustrates a processing procedure of an analysis process that is executed by an analysis apparatus according to an embodiment.

Next, a detail(s) of an analysis process that is executed by an analysis apparatus 31 will be explained with reference to FIG. 6 to FIG. 9. FIG. 6 is a flowchart that illustrates a process procedure of an analysis process that is executed by the analysis apparatus 31 according to an embodiment. Additionally, the analysis apparatus 31 executes each process procedure as illustrated in FIG. 6, based on control of a controller 5 (see FIG. 1) of a control device 4 (see FIG. 1).

First, the controller 5 provides a valve 102 and a valve 112 in closed states thereof, and subsequently, changes a valve 133 from a closed state to an open state thereof, so that a gas is supplied from a gas supply source 132 to an inside of a chamber 90 and an inside of the chamber 90 is released at an atmospheric pressure (step S101). Additionally, after an inside of the chamber 90 is released at an atmospheric pressure, the valve 133 is returned to a closed state thereof.

Then, the controller 5 controls the transfer device 41 and/or the like, so as to carry a bonded substrate T that is formed by a bonding device 33 in an inside of the chamber 90 from the bonding device 33 through a carry-in/out port (step S102). Then, the controller 5 controls a substrate holding unit 50, a substrate holding unit 70, and the like, so as to hold a bonded substrate T from above and below (step S103).

Additionally, a bonded substrate T that is carried in the chamber 90 and is analyzed is not limited to a bonded substrate T immediately after being formed by the bonding device 33, and may be a bonded substrate T that is separately carried therein from the carry-in/out station 2, and/or the like.

Additionally, a polymerization substrate T that is carried in the chamber 90 and is analyzed is not limited to a polymerization substrate T immediately after being formed by the bonding device 33, and may be a polymerization substrate T that is separately carried therein from the carry-in/out station 2, and/or the like.

Then, the controller 5 changes the valve 102 from a closed state to an open state thereof, so that vacuum exhaust of an inside of the chamber 90 is executed by a first exhaust unit 100 (step S104). Then, after an inside of the chamber 90 is provided at a predetermined pressure (for example, 1 Pa) or less, the controller 5 heats the chamber 90 to a predetermined temperature (for example, about 120° C.) by a heating mechanism that is provided in the chamber 90 (step S105).

Thereby, it is possible to emit a gas molecule(s) that remain(s) and/or is/are dissolved in an inner surface of a wall and/or an inside of such a wall in the chamber 90 to an internal space of the chamber 90. Therefore, according to an embodiment, it is possible to reduce or prevent detection of such a gas molecule(s) as noise in a subsequent analysis process, so that it is possible to improve accuracy of analysis.

Additionally, such a process at step S105 does not only heat the chamber 90 but may also heat an upstream side of the valve 102 on a first exhaust route 101, an upstream side of the valve 112 on a second exhaust route 111, and a downstream side of the valve 133 on a supply route 131.

Thus, a site that is released at an atmospheric pressure similarly to an inside of the chamber 90 in an atmospheric release process for the chamber 90 and in a vacuum exhaust process for the chamber 90 and is vacuum-exhausted similarly to an inside of the chamber 90 in a vacuum exhaust process for the chamber 90 is heated, so that it is possible to further improve accuracy of analysis.

An explanation for FIG. 6 will be returned to. After a process at step S105 is executed for a predetermined period of time (for example, about 3 hours), the controller 5 changes the valve 102 from an open state to a closed state thereof, and changes the valve 112 from a closed state to an open state thereof. Thereby, the controller 5 executes vacuum exhaust of an inside of the chamber 90 by the second exhaust unit 110 (step S106).

Figure 7:
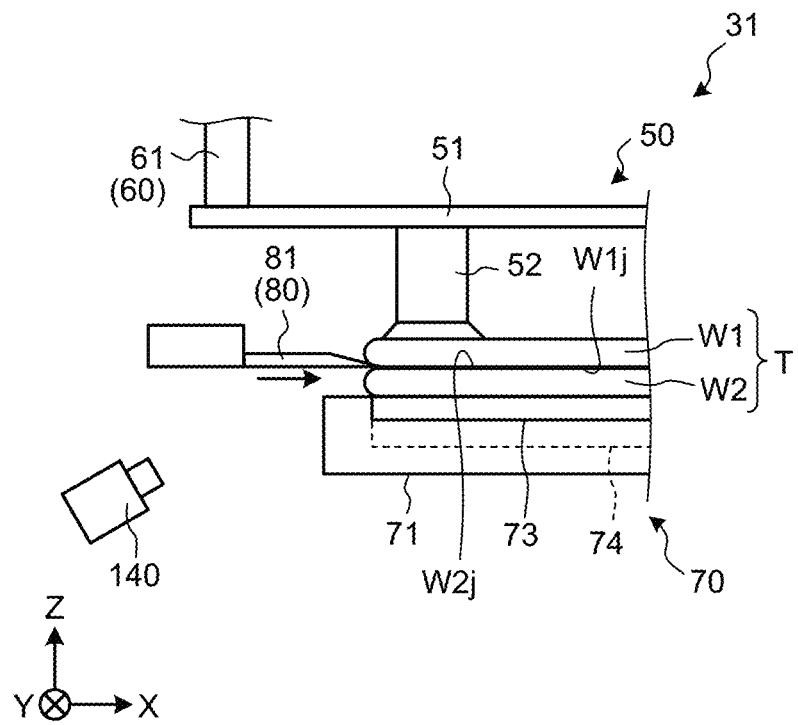
FIG. 7 is a diagram for explaining a release process according to an embodiment.
Figure 8:
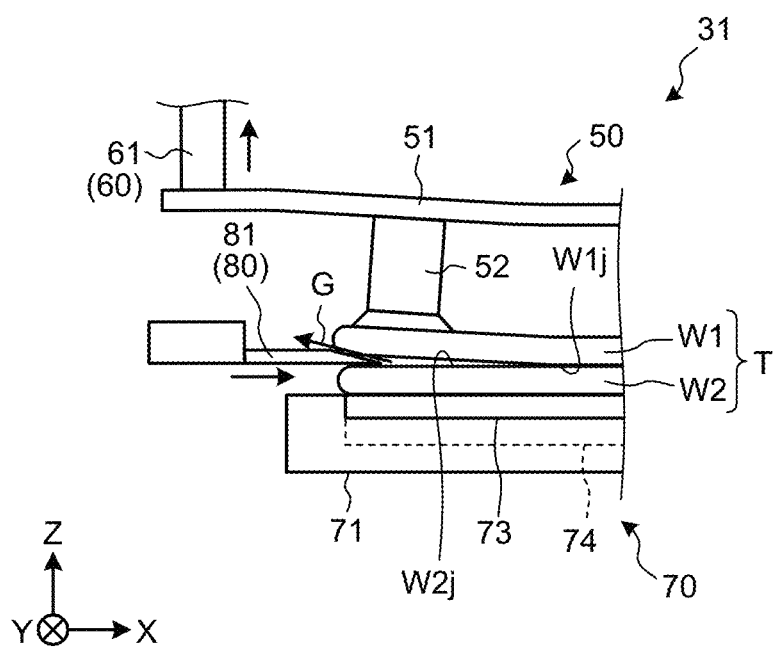
FIG. 8 is a diagram for explaining a release process according to an embodiment.
Figure 9:
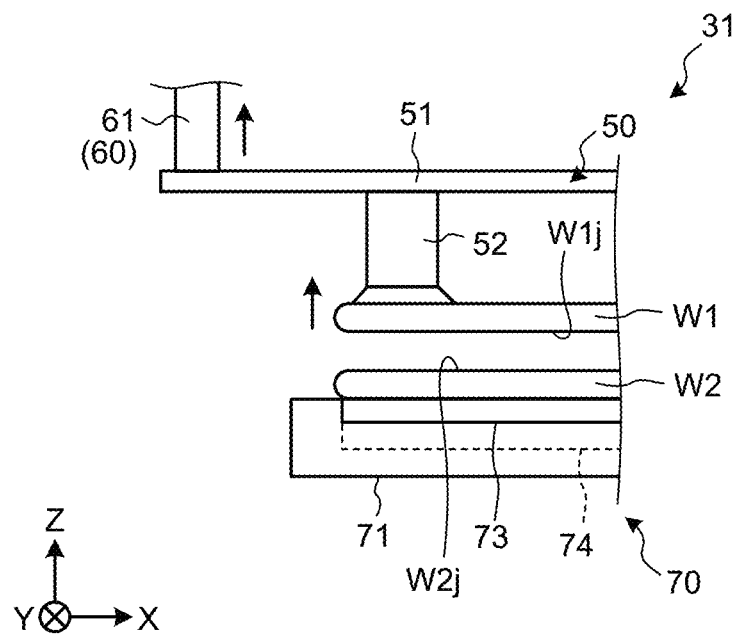
FIG. 9 is a diagram for explaining a release process according to an embodiment.

Then, the controller 5 releases an upper wafer W1 from a bonded substrate T (step S107). A detail(s) of such a release process will be explained by using FIG. 7 to FIG. 9. FIG. 7 to FIG. 9 are diagrams for explaining a release process according to an embodiment.

First, as illustrated in FIG. 7, the controller 5 controls a release induction unit 80 so as to push a blade unit 81 against a side surface of a bonded substrate T and insert the blade unit 81 between a bonding surface W1j of an upper wafer W1 and a bonding surface W2j of a lower wafer W2 in such a bonded substrate T.

Herein, the controller 5 pushes the blade unit 81 against a side surface of a bonded substrate T that is positioned near an adsorption unit 52 that is arranged on a side of a negative direction of an X-axis. Furthermore, the controller 5 determines whether or not the blade unit 81 contacts a bonding surface W1j and a bonding surface W2j where an insertion position is provided therebetween while viewing is executed by using a camera 140.

That is, the controller 5 moves the blade unit 81 from a standby position on a side of a negative direction of an X-axis to an insertion position on a side of a positive direction of an X-axis that is positioned on a side surface of a bonded substrate T, and inserts the blade unit 81 between a bonding surface W1j and a bonding surface W2j from such an insertion position.

Furthermore, the controller 5 moves a part of an outer peripheral part of the substrate holding unit 50, specifically, an extension unit 51b (see FIG. 4) of an elastic member 51 in a direction away from the substrate holding unit 70, in parallel with a process that inserts the blade unit 81.

Thereby, the adsorption unit 52 that is arranged near a site where the blade unit 81 is inserted is pulled up. Accordingly, as illustrated in FIG. 8, an upper wafer W1 starts to release from a bonded substrate T where a site where the blade unit 81 is inserted is a starting point thereof.

Herein, in an embodiment, vacuum exhaust of an inside of the chamber 90 is executed by the second exhaust unit 110, so that, as an upper wafer W1 starts to release, a gas or gasses G that is/are present between such a bonding surface W1j and a bonding surface W2j is jetted from between the bonding surface W1j and the bonding surface W2j.

Subsequently, the controller 5 inserts the blade unit 81 between a bonding surface W1j of an upper wafer W1 and a bonding surface W2j of a lower wafer W2 and operates a movement unit 60 so as to further pull up the substrate holding unit 50.

Thereby, a release is continuously advanced from an end part of an upper wafer W1 on a side of a negative direction of an X-axis toward an end part thereof on a side of a positive direction of the X-axis, and finally, as illustrated in FIG. 9, the upper wafer W1 is released from a bonded substrate T (see FIG. 8). Thereby, a series of release processes is ended.

An explanation for FIG. 6 will be returned to. In parallel with a release process for an upper wafer W1 as thud far explained, the controller 5 controls a gas analysis unit 120 so as to analyze a component(s) of a gas or gasses G that is/are jetted from between a bonding surface W1j and a bonding surface W2j (step S108).

Herein, in an embodiment, a release process for an upper wafer W1 is executed while vacuum exhaust of an inside of the chamber 90 is executed by the second exhaust unit 110, so that a gas or gasses G that is/are jetted from a bonded substrate T is/are discharged to an exhaust unit EXH through a retention unit 113. Hence, it is possible for the gas analysis unit 120 that is connected to the retention unit 113 to analyze a gas or gasses that is/are jetted from a bonded substrate T accurately.

Thus, in an embodiment, a release process and a gas analysis process are executed in parallel, so that it is possible to analyze a gas or gasses G that is/are present on an interface between an upper wafer W1 and a lower wafer W2 accurately. Then, it is estimated that at least a part of such a gas or gasses G is present on an interface between an upper wafer W1 and a lower wafer W2 due to a chemical reaction that occurs at a time of bonding of the upper wafer W1 and the lower wafer W2.

Therefore, according to an embodiment, a gas or gasses G that is/are present on such an interface is analyzed accurately, so that it is possible to obtain information for analyzing a mechanism(s) of a chemical reaction and/or bonding that occur(s) at a time of bonding of an upper wafer W1 and a lower wafer W2.

Furthermore, in an embodiment, the gas analysis unit 120 is preferably connected to the second exhaust route 111 of the second exhaust unit 110. Thus, the gas analysis unit 120 is connected to the second exhaust route 111 where a jetted gas or gasses G is/are collected and discharged, so that it is possible to detect a larger amount(s) of a gas or gasses G that is/are jetted from a bonded substrate T and hence it is possible to analyze a gas or gasses G accurately.

Therefore, according to an embodiment, it is possible to obtain accurate information for analyzing a mechanism(s) of a chemical reaction and/or bonding that occur(s) at a time of bonding of an upper wafer W1 and a lower wafer W2.

Furthermore, in an embodiment, the gas analysis unit 120 may be connected to the retention unit 113 with a box shape. Thereby, it is possible to introduce a larger amount(s) of a jetted gas or gasses G to the gas analysis unit 120, as compared with a case where the gas analysis unit 120 is directly connected to the second exhaust unit 110 with a tubular shape.

Therefore, according to an embodiment, it is possible to analyze a larger amount(s) of a gas or gasses G that is/are jetted from a bonded substrate T, so that it is possible to obtain accurate information for analyzing a mechanism(s) of a chemical reaction and/or bonding that occur(s) at a time of bonding of an upper wafer W1 and a lower wafer W2.

Additionally, in the present disclosure, a case where the gas analysis unit 120 is connected to the retention unit 113 with a box shape is not a limitation. For example, the gas analysis unit 120 may be connected to a retention unit 113 with another shape or may directly be connected to the second exhaust route 111 with a tubular shape.

Furthermore, in an embodiment, before a gas or gasses G is/are jetted from a bonding part of a bonded substrate T, an inside of the chamber 90 may preliminarily be exhausted to a predetermined pressure or less, by using the first exhaust unit 100 that is different from the second exhaust unit 110.

Thus, the dedicated first exhaust unit 100 that exhausts an inside of the chamber 90 to a needed pressure is provided separately from the second exhaust unit 110 that is used in a gas analysis process, so that it is possible to prevent an inside of the second exhaust route 111 (for example, the gas analysis unit 120 and/or the like) from being exposed to atmosphere.

Therefore, according to an embodiment, it is possible to analyze a gas or gasses G that is/are jetted from a bonded substrate T accurately, so that it is possible to obtain accurate information for analyzing a mechanism(s) of a chemical reaction and/or bonding that occur(s) at a time of bonding of an upper wafer W1 and a lower wafer W2.

Furthermore, in an embodiment, after an inside of the chamber 90 is exhausted by the first exhaust unit 100, movement mechanisms 82, 83 may be controlled so as to move the blade unit 81 to an insertion position while an inside of the chamber 90 is sequentially exhausted by the second exhaust unit 110.

Thus, after an impurity gas is discharged from an inside of the chamber 90 by the first exhaust unit 100 as much as possible, a release process for a bonded substrate T is executed while an inside of the chamber 90 is exhausted by the second exhaust unit 110, so that it is possible to execute an analysis process for a gas or gasses G under an environment with a smaller amount of an impurity gas.

Therefore, according to an embodiment, it is possible to analyze a gas or gasses G that is/are jetted from a bonded substrate T accurately, so that it is possible to obtain accurate information for analyzing a mechanism(s) of a chemical reaction and/or bonding that occur(s) at a time of bonding of an upper wafer W1 and a lower wafer W2.

Furthermore, in an embodiment, an exhaust velocity of a pump 103 may be greater than an exhaust velocity of a pump 114. Thus, an exhaust velocity of the pump 103 that exhausts an inside of the chamber 90 from an atmospheric pressure to a predetermined pressure is greater than that of the pump 114 that is used in a gas analysis process, so that it is possible to exhaust an inside of the chamber 90 to a predetermined pressure or less in a shorter time.

Therefore, according to an embodiment, it is possible to execute an analysis process more efficiently.

Furthermore, in an embodiment, the chamber 90 may have the camera 140 that is capable of viewing an internal insertion position. Thereby, it is possible to execute a release process while whether or not the blade unit 81 contacts a bonding surface W1j and a bonding surface W2j is viewed by the camera 140, so that it is possible to execute an analysis process efficiently.

Furthermore, in an embodiment, the gas analysis unit 120 may be a mass spectrometer such as a QMS. Thereby, it is possible to detect a kind(s) of a gas or gasses G that is/are jetted from a bonded substrate T, an amount of each gas species, and the like, accurately.

Therefore, according to an embodiment, it is possible to obtain accurate information for analyzing a mechanism(s) of a chemical reaction and/or bonding that occur(s) at a time of bonding of an upper wafer W1 and a lower wafer W2.

Furthermore, in an embodiment, a gas or gasses G may be analyzed while a bonded substrate T is split by the blade unit 81 such as a flat blade without analyzing the gas or gasses G while the bonded substrate T is broken by a member such as a drill. Thereby, it is possible to execute mass spectrometry where a gas or gasses G that is/are present between a bonding surface W1j of an upper wafer W1 and a bonding surface W2j of a lower wafer W2 is focused among gasses that are present inside a bonded substrate T.

Therefore, according to an embodiment, it is possible to obtain accurate information for analyzing a mechanism(s) of a chemical reaction and/or bonding that occur(s) at a time of bonding of an upper wafer W1 and a lower wafer W2.

Furthermore, in an embodiment, the analysis apparatus 31 may be provided in a bonding system 1. Thereby, it is possible to analyze a bonded substrate T that is formed by the bonding device 33 of the bonding system 1 in line.

Additionally, in the present disclosure, a case where the analysis apparatus 31 is provided in the bonding system 1 is not a limitation, and the analysis apparatus 31 may be incorporated inside another system or the analysis apparatus 31 may be independent as a single device.

An explanation for FIG. 6 will be returned to. After processes at step S107 and step S108 are ended, the controller 5 releases an inside of the chamber 90 at an atmospheric pressure according to a procedure that is identical to that of a process at step S101 as described above (step S109). Additionally, after an inside of the chamber 90 is released at an atmospheric pressure, the valve 133 is returned to a closed state thereof.

Finally, the controller 5 carries an upper wafer W1 and a lower wafer W2 out of the chamber 90 that is released at an atmospheric pressure (step S110), and ends a series of analysis processes.

Although an example where a release process for a bonded substrate T is executed while the blade unit 81 is moved to an insertion position by the movement mechanisms 82, 83 has been illustrated in an embodiment as described above, the present disclosure is not limited to such an example. For example, in the present disclosure, a release process for a bonded substrate T may be executed while the substrate holding units 50, 70 are driven so as to move the bonded substrate T that is held by such substrate holding units 50, 70 toward the blade unit 81.

Moreover, in the present disclosure, a release process for a bonded substrate T may be executed while both the blade unit 81 and a bonded substrate T are moved. Thereby, it is also possible to execute a release process and a gas analysis process in parallel.

Furthermore, in the present disclosure, a temporal transition of a jetted gas or gasses G may be measured in a gas analysis process. Thereby, it is possible to analyze a difference(s) of a mechanism(s) of a chemical reaction and/or bonding between respective sites of a bonded substrate T (for example, a peripheral part and a central part thereof) in detail.

Furthermore, although an example where a release process and a gas analysis process are executed while a bonded substrate T is held horizontally has been illustrated in the present disclosure, the present disclosure is not limited to such an example, and for example, a release process and a gas analysis process may be executed while the bonded substrate T is heled perpendicularly.

Furthermore, although an example where a release process and a gas analysis process are executed for a whole of a bonded substrate T has been illustrated in the present disclosure, the present disclosure is not limited to such an example, and for example, a release process and a gas analysis process may be executed for a fragment of the bonded substrate T.

Thereby, it is possible to analyze a difference(s) of a mechanism(s) of a chemical reaction and/or bonding between respective sites of a bonded substrate Tin detail.

Example of Result of Analysis of Bonding Mechanism

Next, an example of a result of analysis of a bonding mechanism of a bonded substrate T that uses an analysis apparatus 31 according to an embodiment will be explained. Additionally, analysis in the present disclosure is executed by using a plurality of kinds of bonded substrates T where plasma of a processing gas that is used for modification of bonding surfaces W1j, W2j is changed variously in a surface modification device 30.

Specifically, in the present disclosure, nitrogen ($N_2$) or oxygen ($O_2$) is used as a processing gas, and further, an input electric power at a time when plasma of each processing gas is generated is controlled so as to provide a low value (Low) or a high value (High).

Figure 10:
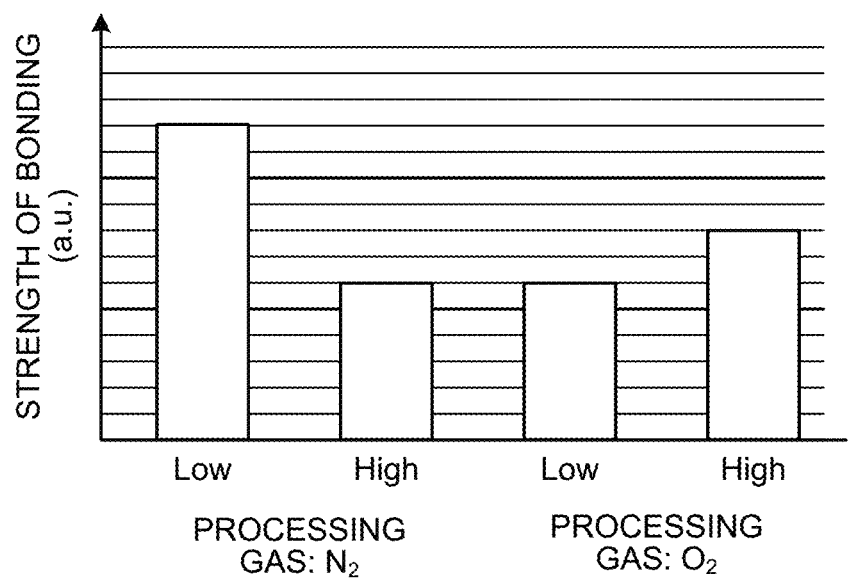
FIG. 10 is a diagram that illustrates a relationship between a plasma condition in a surface modification process and a bonding strength of each bonded substrate.

FIG. 10 is a diagram that illustrates a relationship between a plasma condition in a surface modification process and a bonding strength of each bonded substrate T. As illustrated in FIG. 10, in comparison between a bonded substrate T where nitrogen is used as a processing gas and a bonded substrate T where oxygen is used as a processing gas, it is found that a strength of bonding of an upper wafer W1 and a lower wafer W2 in a bonded substrate T where nitrogen is used as a processing gas is higher.

Furthermore, in a case where nitrogen is used as a processing gas, in comparison between a bonded substrate T where an input electric power at a time when plasma is generated is low and a bonded substrate T where such an input electric power is high, it is found that a strength of bonding of an upper wafer W1 and a lower wafer W2 in a bonded substrate T where an input electric power is low is higher.

Figure 11:
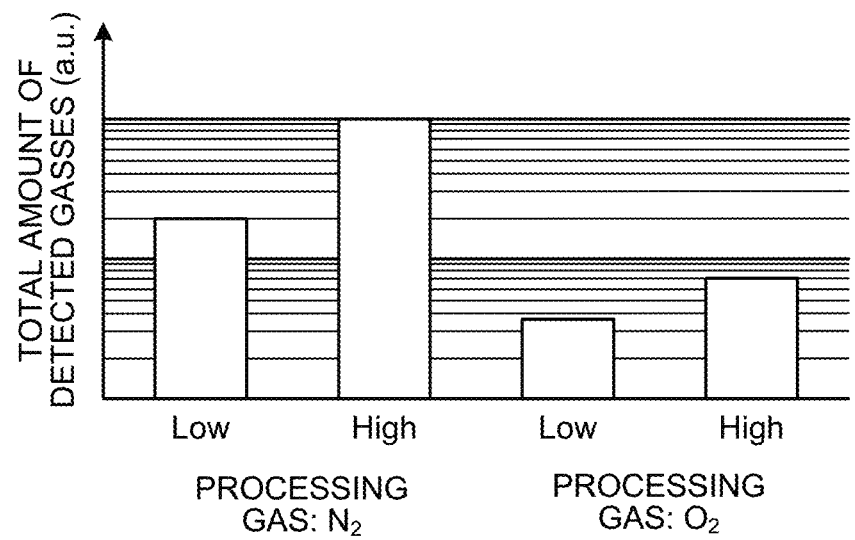
FIG. 11 is a diagram that illustrates a relationship between a plasma condition in a surface modification process and a total amount of detected gasses that is measured in an analysis process according to an embodiment.

FIG. 11 is a diagram that illustrates a relationship between a plasma condition in a surface modification process and a total amount of detected gasses that is measured in an analysis process according to an embodiment. As illustrated in FIG. 11, in a case where nitrogen is used as a processing gas, in comparison between a bonded substrate T where an input electric power at a time when plasma is generated is low and a bonded substrate T where an input electric power is high, it is found that a total amount of detected gasses G for a bonded substrate T where an input electric power is high is greater.

Figure 12:
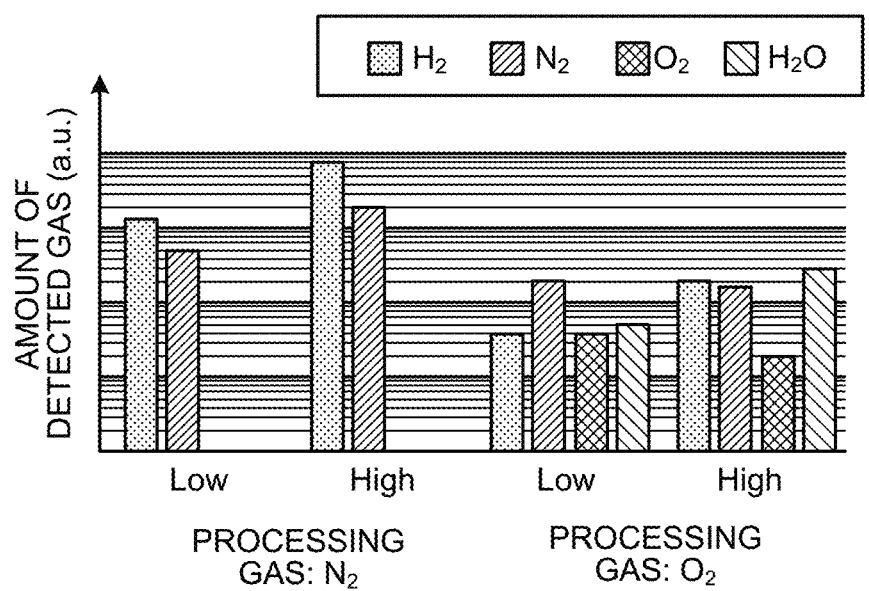
FIG. 12 is a diagram that illustrates a relationship between a plasma condition in a surface modification process and an amount of a detected gas for each gas species that is measured in an analysis process according to an embodiment.

FIG. 12 is a diagram that illustrates a relationship between a plasma condition in a surface modification process and an amount of a detected gas for each gas species that is measured in an analysis process according to an embodiment.

As illustrated in FIG. 12, it is found that hydrogen (H2) and nitrogen are detected as gas species that are included in a gas G for a bonded substrate T where nitrogen is used as a processing gas. On the other hand, it is found that oxygen and water vapor (H2O) in addition to hydrogen and nitrogen are detected as gas species that are included in a gas G in a bonded substrate T where oxygen is used as a processing gas.

Based on a result of analysis as thus far obtained, a result of analysis of a bonding mechanism in a bonded substrate T where nitrogen is used as a processing gas and a result of analysis of a bonding mechanism in a bonded substrate T where oxygen is used as a processing gas will be explained below.

Figure 13:
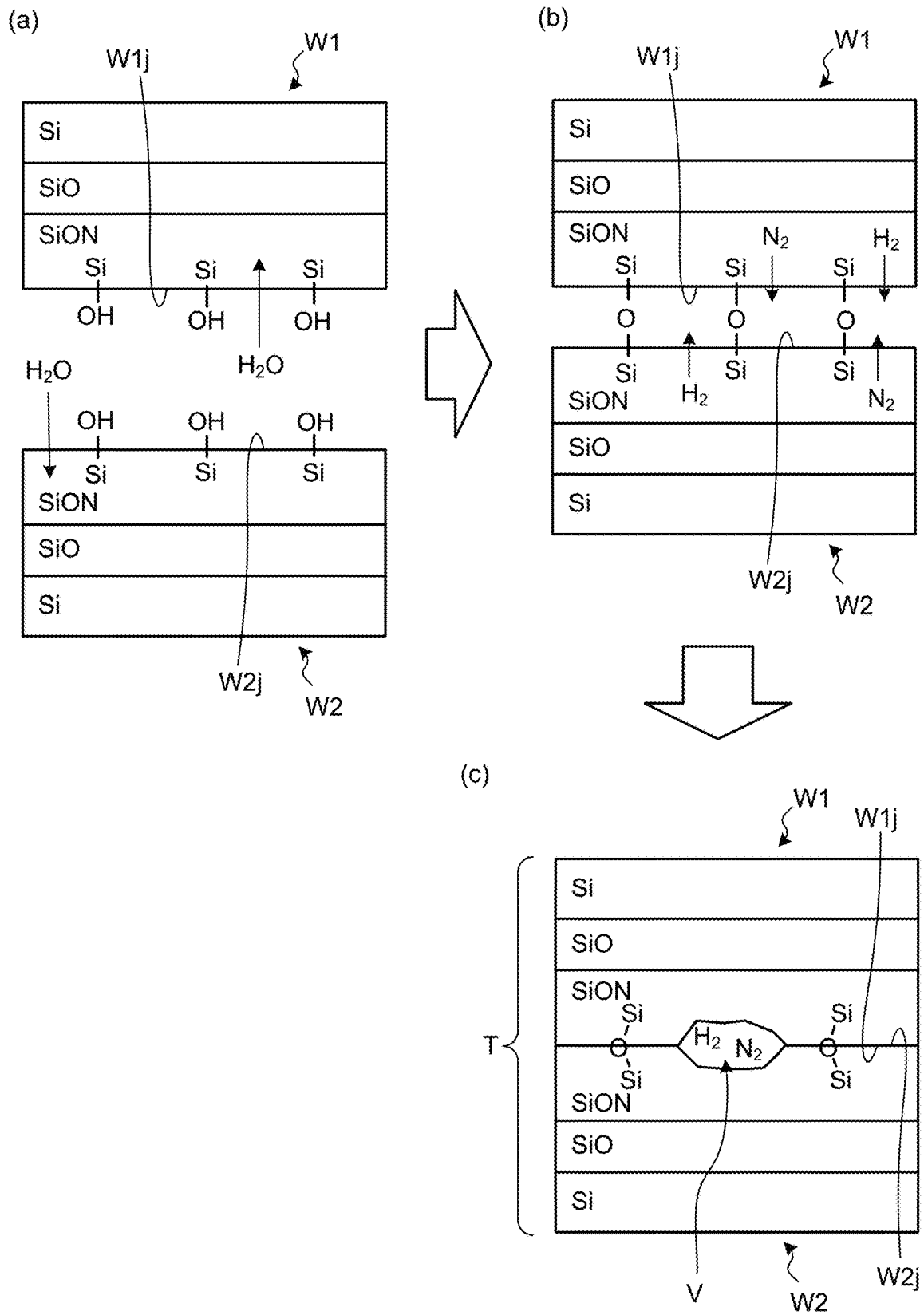
FIG. 13 is a diagram that includes 3 sub-parts (FIG. 13($a$), FIG. 13($b$), and FIG. 13($c$)) for explaining a result of analysis of a bonding mechanism on a bonded substrate where nitrogen is used as a processing gas.

FIG. 13 is a diagram for explaining a result of analysis of a bonding mechanism in a bonded substrate T where nitrogen is used as a processing gas. As illustrated in (a) of FIG. 13, an oxide film (SiO) is formed on a surface of silicon (Si) for a bonding surface W1j of an upper wafer W1 and a bonding surface W2j of a lower wafer W2 immediately before a boding process.

Furthermore, a damaged amorphous-like nitride oxide film (SiON) is formed on a surface of an oxide film for bonding surfaces W1j, W2j, in a plasma process that uses nitrogen as a processing gas. Moreover, a large number of silanol groups (Si—OH) are formed on outermost surfaces for bonding surfaces W1j, W2j by a surface hydrophilization process after a plasma process.

Then, water vapor that originates from an impurity gas and/or the like is present between a bonding surface W1j and a bonding surface W2j. Such water vapor is diffused to, for example, an inside of a nitride oxide film on a surface thereof and/or the like.

Then, as illustrated in (b) of FIG. 13, as a bonding surface W1j and a bonding surface W2j contact one another, silanol groups that are positioned on outermost surfaces thereof cause a chemical reaction that is represented by chemical formula (1) as provided below, $$(Si-OH)+(Si-OH) \leftrightarrows (Si-O-Si)+H_2O \quad (1)$$

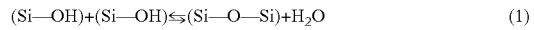

so that a siloxane bond (Si—O—Si) is formed between the bonding surface W1j and the bonding surface W2j.

Such a siloxane bond is a very strong bond, so that the siloxane bond is formed between a bonding surface W1j and a bonding surface W2j and thereby an upper wafer W1 and a lower wafer W2 are bonded strongly.

On the other hand, chemical formula (1) as described above is a reversible reaction, so that, as water vapor is present on an interface between a bonding surface W1j and a bonding surface W2j, a siloxane bond is returned to silanol groups due to a reverse reaction. Thereby, a strength of bonding of an upper wafer W1 and a lower wafer W2 is decreased.

Furthermore, in a state as illustrated in (b) of FIG. 13, silicon nitride (SiN) that is included in a nitride oxide film and water vapor that is present inside the nitride oxide film are changed to silicon oxide, nitrogen, and hydrogen due to a chemical reaction that is represented by chemical formula (2) as provided below.

$$2SiN+2H_2O \rightarrow 2SiO+N_2+2H_2 \quad (2)$$

That is because a silicon atom that is included in silicon nitride bonds to an oxygen atom more readily than to a nitrogen atom.

Then, nitrogen and hydrogen that are produced according to chemical formula (2) as described above are diffused, for example, between a bonding surface W1j and a bonding surface W2j.

Then, as illustrated in (c) of FIG. 13, as a siloxane bond between a bonding surface W1j and a bonding surface W2j is sufficiently formed according to chemical formula (1) as described above, an upper wafer W1 and a lower wafer W2 are bonded so as to form a bonded substrate T.

Then, a vacancy or vacancies V is/are formed between a bonding surface W1j and a bonding surface W2j in a bonded substrate T where nitrogen is used as a processing gas due to nitrogen and hydrogen that are produced according to chemical formula (2) as described above. That is, nitrogen and hydrogen are present in such a vacancy or vacancies V.

Then, an area where such a vacancy or vacancies V is/are formed on an interface between an upper wafer W1 and a lower wafer W2 does not contribute to bonding of the upper wafer W1 and the lower wafer W2, so that a strength of bonding of the upper wafer W1 and the lower wafer W2 is decreased with increasing a vacancy or vacancies V on an interface therebetween.

Hence, as illustrated in FIG. 10 and FIG. 11, a larger number of vacancies V are formed on an interface of a bonded substrate T where a total amount of detected gases G is large and an input electric power is high, so that it is possible to estimate that a strength of bonding is decreased.

Furthermore, a larger amount of silicon nitride is formed on outermost surfaces for bonding surfaces W1j, W2j due to nitrogen plasma with a high density, so that it is possible to estimate that a reason why a total amount of detected gasses G for a bonded substrate T where an input electric power is high is larger is that a reaction according to chemical formula (2) as described above is accelerated.

Figure 14:
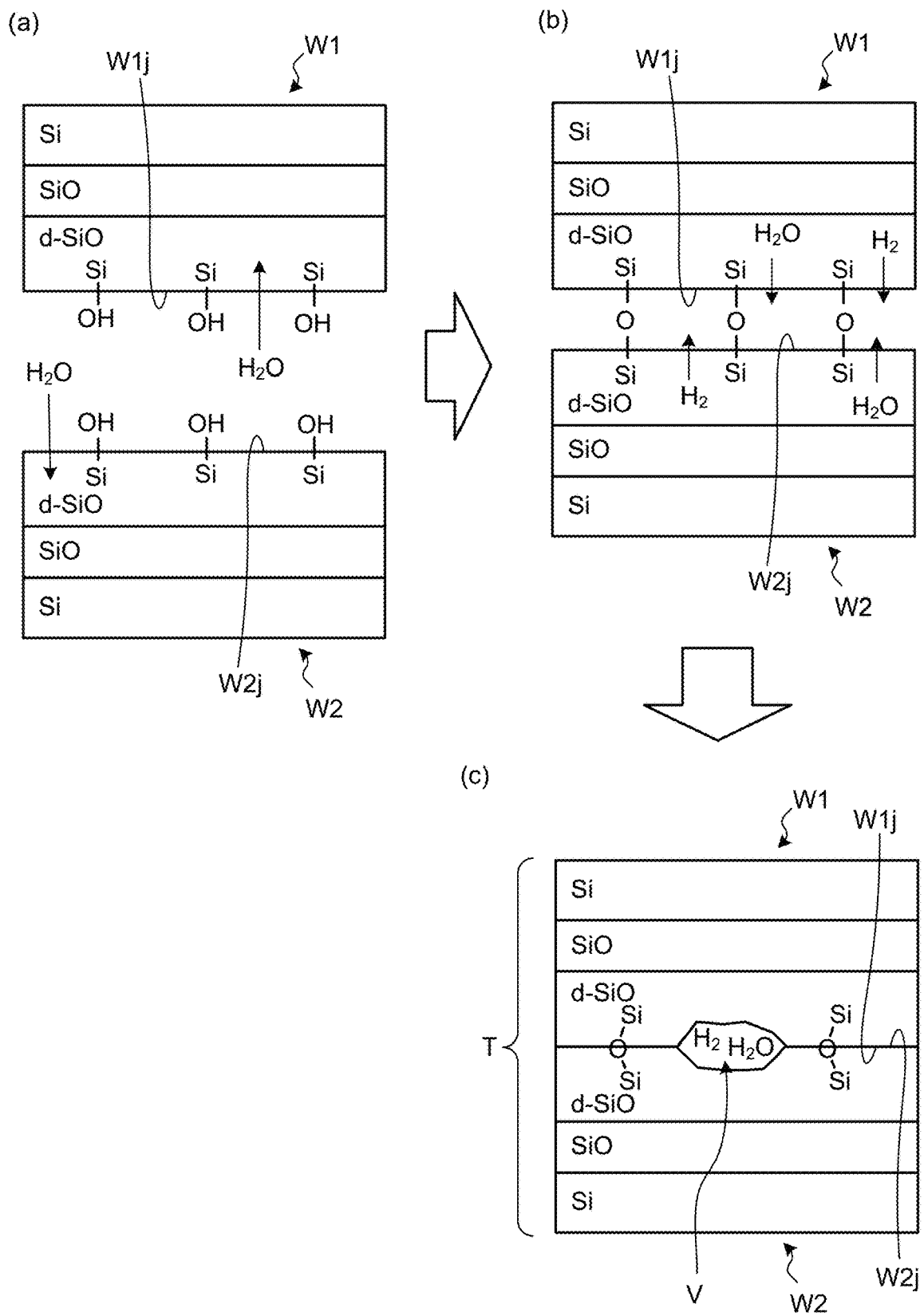
FIG. 14 is a diagram that includes 3 sub-parts (FIG. 14($a$), FIG. 14($b$), and FIG. 14($c$)) for explaining a result of analysis of a bonding mechanism on a bonded substrate where oxygen is used as a processing gas.

FIG. 14 is a diagram for explaining a result of analysis of a bonding mechanism in a bonded substrate T where oxygen is used as a processing gas. As illustrated in (a) of FIG. 14, an oxide film (SiO) is formed on a surface of silicon (Si) for a bonding surface W1j of an upper wafer W1 and a bonding surface W2j of a lower wafer W2 immediately before a boding process.

Furthermore, a damaged amorphous-like oxide film (that will also be called a damaged oxide film (d-SiO) below) is formed on a surface of an oxide film for bonding surfaces W1j, W2j, in a plasma process that uses oxygen as a processing gas. Moreover, a large number of silanol groups (Si—OH) are formed on outermost surfaces for bonding surfaces W1j, W2j in a surface hydrophilization process after a plasma process.

Then, water vapor that originates from an impurity gas and/or the like is present between a bonding surface W1j and a bonding surface W2j. Such water vapor is diffused to, for example, an inside of a damaged oxide film on an outermost surface thereof, etc.

Then, as illustrated in (b) of FIG. 14, as a bonding surface W1j and a bonding surface W2j contact one another, silanol groups that are positioned on outermost surfaces thereof cause a chemical reaction that is represented by chemical formula (1) as provided above, so that a siloxane bond (Si—O—Si) is formed between the bonding surface W1j and the bonding surface W2j.

Furthermore, in a state as illustrated in (b) of FIG. 14, an excited silicon atom (Si*) that is included in a damaged oxide film and a part of water vapor that is present inside the damaged oxide film are changed to silicon oxide and hydrogen due to a chemical reaction that is represented by chemical formula (3) as provided below.

$$Si^* + H_2O \rightarrow SiO + H_2 \quad (3)$$

Then, hydrogen that is produced according to chemical formula (3) as described above and water vapor that remains unreacted and remains inside a damaged oxide film are diffused, for example, between a bonding surface W1j and a bonding surface W2j.

Then, as illustrated in (c) of FIG. 14, as a siloxane bond between a bonding surface W1j and a bonding surface W2j is sufficiently formed according to chemical formula (1) as described above, an upper wafer W1 and a lower wafer W2 are bonded so as to form a bonded substrate T.

Then, a vacancy or vacancies V is/are formed between a bonding surface W1j and a bonding surface W2j in a bonded substrate T where oxygen is used as a processing gas due to hydrogen that is produced according to chemical formula (3) as described above and water vapor that originates from an impurity gas and/or the like. That is, at least hydrogen and water vapor are present in such a vacancy or vacancies V.

Then, in a case where water vapor is present on an interface between an upper wafer W1 and a lower wafer W2, a siloxane bond is returned to silanol groups due to a reverse reaction according to chemical formula (1) as described above. Thereby, a strength of bonding of an upper wafer W1 and a lower wafer W2 is decreased.

That is, as illustrated in FIG. 10 and FIG. 12, water vapor is included in a gas G for a bonded substrate T where oxygen is used as a processing gas, so that it is possible to estimate that a strength of bonding is decreased.

As thus far explained, in an embodiment, a gas or gasses G that is/are present on an interface between an upper wafer W1 and an lower wafer W2 is analyzed, so that it is possible to obtain information for analyzing a mechanism(s) of a chemical reaction and/or bonding that occur(s) at a time of bonding of the upper wafer W1 and the lower wafer W2.

An analysis apparatus 31 according to an embodiment includes a substrate holding unit 50, 70, an insertion unit (a blade unit 81), and a gas analysis unit 120. The substrate holding unit 50, 70 holds a bonded substrate T where a first substrate (an upper wafer W1) and a second substrate (a lower wafer W2) are bonded. The insertion unit (the blade unit 81) is capable of being inserted between a bonding surface W1j of the first substrate (the upper wafer W1) and a bonding surface W2j of the second substrate (the lower wafer W2) in the bonded substrate T that is held by the substrate holding unit 50, 70. The gas analysis unit 120 analyzes a component(s) of a gas or gasses G that is/are jetted from between a bonding surface W1j of the first substrate (the upper wafer W1) and a bonding surface W2j of the second substrate (the lower wafer W2). Thereby, it is possible to obtain information for analyzing a mechanism(s) of a chemical reaction and/or bonding that occur(s) at a time of bonding of an upper wafer W1 and a lower wafer W2.

Furthermore, the analysis apparatus 31 according to an embodiment further includes a chamber 90 that houses the bonded substrate T that is held by the substrate holding unit 50, 70, and an exhaust mechanism (a pump 114) that exhausts the chamber 90 through an exhaust route (a second exhaust route 111). Furthermore, the gas analysis unit 120 is connected to the exhaust route (the second exhaust route 111). Thereby, it is possible to obtain accurate information for analyzing a mechanism(s) of a chemical reaction and/or bonding that occur(s) at a time of bonding of an upper wafer W1 and a lower wafer W2.

Furthermore, the analysis apparatus 31 according to an embodiment further includes another exhaust mechanism (a pump 103) that exhausts the chamber 90 through another exhaust route (a first exhaust route 101), and a controller 5 that controls each unit. Furthermore, the controller 5 controls the another exhaust mechanism (the pump 103) so as to exhaust the chamber 90 to a predetermined pressure or less preliminarily before a gas or gasses G is/are jetted from between a bonding surface W1j of the first substrate (the upper wafer W1) and a bonding surface W2j of the second substrate (the lower wafer W2). Thereby, it is possible to obtain accurate information for analyzing a mechanism(s) of a chemical reaction and/or bonding that occur(s) at a time of bonding of an upper wafer W1 and a lower wafer W2.

Furthermore, the analysis apparatus 31 according to an embodiment further includes a movement mechanism 82, 83. The movement mechanism 82, 83 relatively moves the substrate holding unit 50 or the insertion unit (the blade unit 81) between an insertion position between a bonding surface W1j of the first substrate (the upper wafer W1) and a bonding surface W2j of the second substrate (the lower wafer W2) and a separation position that separates from the insertion position. Furthermore, the controller 5 causes the movement mechanism 82, 83 to move the substrate holding unit 50, 70 or the insertion unit (the blade unit 81) from the separation position to the insertion position while the chamber 90 is exhausted by the exhaust mechanism (the pump 114), after the chamber 90 is exhausted by the another exhaust mechanism (the pump 103). Thereby, it is possible to obtain accurate information for analyzing a mechanism(s) of a chemical reaction and/or bonding that occur(s) at a time of bonding of an upper wafer W1 and a lower wafer W2.

Furthermore, in the analysis apparatus 31 according to an embodiment, an exhaust velocity of the another exhaust mechanism (the pump 103) is greater than that of the exhaust mechanism (the pump 114). Thereby, it is possible to execute an analysis process more efficiently.

Furthermore, in the analysis apparatus 31 according to an embodiment, the chamber 90 has a camera 140 that is capable of viewing the insertion position in an inside thereof. Thereby, it is possible to obtain accurate information for analyzing a mechanism(s) of a chemical reaction and/or bonding that occur(s) at a time of bonding of an upper wafer W1 and a lower wafer W2.

Furthermore, in the analysis apparatus 31 according to an embodiment, the exhaust route (the second exhaust route 111) has a retention unit 113 with a box shape. Furthermore, the gas analysis unit 120 is connected to the retention unit 113. Thereby, it is possible to obtain accurate information for analyzing a mechanism(s) of a chemical reaction and/or bonding that occur(s) at a time of bonding of an upper wafer W1 and a lower wafer W2.

Furthermore, the analysis apparatus 31 according to an embodiment further includes a heating mechanism that heats the chamber 90. Thereby, it is possible to improve accuracy of analysis of a gas or gasses G.

Furthermore, in the analysis apparatus 31 according to an embodiment, the gas analysis unit 120 is a mass spectrometer. Thereby, it is possible to obtain accurate information for analyzing a mechanism(s) of a chemical reaction and/or bonding that occur(s) at a time of bonding of an upper wafer W1 and a lower wafer W2.

Furthermore, a bonding system 1 according to an embodiment includes a bonding device 33, the analysis apparatus 31 as described above, and a transfer device 41. The bonding device 33 bonds the first substrate (the upper wafer W1) and the second substrate (the lower wafer W2) so as to form the bonded substrate T. The transfer device 41 transfers the bonded substrate T between the bonding device 33 and the analysis apparatus 31. Thereby, it is possible to analyze a bonded substrate T that is formed by a bonding device 33 of a bonding system 1 in line.

Furthermore, an analysis method according to an embodiment includes a substrate holding step (step S103), an insertion step (step S107), and a gas analysis step (step S108). The substrate holding step (step S103) holds a bonded substrate T where a first substrate (an upper wafer W1) and a second substrate (a lower wafer W2) are bonded. The insertion step (step S107) inserts an insertion unit (a blade unit 81) between a bonding surface W1$j$ of the first substrate (the upper wafer W1) and a bonding surface W2$j$ of the second substrate (the lower wafer W2) in the bonded substrate T that is held at the substrate holding step (step S103). The gas analysis step (step S108) analyzes a component(s) of a gas or gasses G that is/are jetted from between a bonding surface W1$j$ of the first substrate (the upper wafer W1) and a bonding surface W2$j$ of the second substrate (the lower wafer W2). Thereby, it is possible to obtain information for analyzing a mechanism(s) of a chemical reaction and/or bonding that occur(s) at a time of bonding of an upper wafer W1 and a lower wafer W2.

Although an embodiment(s) of the present disclosure has/have been explained above, the present disclosure is not limited to an embodiment(s) as described above and it is possible to execute a variety of modifications without departing from an essence thereof.

It should be considered that an embodiment(s) that is/are disclosed herein is/are not limitative but is/are illustrative in all aspects. Indeed, it is possible to implement an embodiment(s) as described above in a wide variety of modes. Furthermore, an embodiment(s) as described above may be omitted, substituted, and/or modified in a wide variety of modes without departing from an appended claim(s) and an essence thereof.

According to the present disclosure, it is possible to obtain information for analyzing a mechanism(s) of a chemical reaction and/or bonding that occur(s) at a time of bonding of substrates.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An analysis apparatus, comprising:
a substrate holding unit that holds a bonded substrate where a first substrate and a second substrate are bonded;
an insertion unit that is capable of being inserted between a bonding surface of the first substrate and a bonding surface of the second substrate in the bonded substrate that is held by the substrate holding unit;
a gas analysis unit that analyzes a component(s) of a gas or gasses that is/are jetted from between a bonding surface of the first substrate and a bonding surface of the second substrate;
a chamber that houses the bonded substrate that is held by the substrate holding unit;
an exhaust mechanism that exhausts the chamber through an exhaust route;
another exhaust mechanism that exhausts the chamber through another exhaust route;
a controller that controls each unit; and
a movement mechanism that relatively moves the substrate holding unit or the insertion unit between an insertion position between a bonding surface of the first substrate and a bonding surface of the second substrate and a separation position that separates from the insertion position, wherein
the gas analysis unit is connected to the exhaust route,
the controller controls the another exhaust mechanism to exhaust the chamber to a predetermined pressure or less preliminarily before a gas or gasses is/are jetted from between a bonding surface of the first substrate and a bonding surface of the second substrate, and
the controller causes the movement mechanism to move the substrate holding unit or the insertion unit from the separation position to the insertion position while the chamber is exhausted by the exhaust mechanism, after the chamber is exhausted by the another exhaust mechanism.

2. The analysis apparatus according to claim 1, wherein an exhaust velocity of the another exhaust mechanism is greater than that of the exhaust mechanism.

3. The analysis apparatus according to claim 1, wherein the chamber has a camera that is capable of viewing the insertion position in an inside thereof.

4. The analysis apparatus according to claim 1, wherein:
the exhaust route has a retention unit with a box shape, and
the gas analysis unit is connected to the retention unit.

5. The analysis apparatus according to claim 1, further comprising a heating mechanism that heats the chamber.

6. The analysis apparatus according to claim 1, wherein the gas analysis unit is a mass spectrometer.

7. A bonding system, comprising:
a bonding device that bonds the first substrate and the second substrate to form the bonded substrate;
the analysis apparatus according to claim 1; and
a transfer device that transfers the bonded substrate between the bonding device and the analysis apparatus.

8. The analysis apparatus according to claim 1, wherein the exhaust mechanism includes a valve and a pump.

9. An analysis method, comprising:
holding, by a substrate holding unit, a bonded substrate where a first substrate and a second substrate are bonded;
inserting an insertion unit between a bonding surface of the first substrate and a bonding surface of the second substrate in the bonded substrate that is held by the substrate holding unit;
analyzing, by a gas analysis unit, a component(s) of a gas or gasses that is/are jetted from between a bonding surface of the first substrate and a bonding surface of the second substrate;
exhausting a chamber that houses the bonded substrate that is held by the substrate holding unit, through an exhaust route where the gas analysis unit is connected thereto;
exhausting the chamber to a predetermined pressure or less preliminarily before a gas or gasses is/are jetted from between a bonding surface of the first substrate and a bonding surface of the second substrate, through another exhaust route; and
moving the substrate holding unit or the insertion unit from a separation position that separates from an insertion position between a bonding surface of the first substrate and a bonding surface of the second substrate to the insertion position while the chamber is exhausted through the exhaust route, after the chamber is exhausted through the another exhaust route.

* * * * *